(12) United States Patent
Zhao

(10) Patent No.: US 11,309,363 B2
(45) Date of Patent: Apr. 19, 2022

(54) DISPLAY PANEL AND MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jinrong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/753,033

(22) PCT Filed: Sep. 29, 2019

(86) PCT No.: PCT/CN2019/108830
§ 371 (c)(1),
(2) Date: Apr. 2, 2020

(87) PCT Pub. No.: WO2021/017148
PCT Pub. Date: Feb. 4, 2021

(65) Prior Publication Data
US 2021/0036068 A1 Feb. 4, 2021

(51) Int. Cl.
*H01L 27/32* (2006.01)
*H01L 51/00* (2006.01)
(Continued)

(52) U.S. Cl.
CPC ...... *H01L 27/3225* (2013.01); *H01L 27/3246* (2013.01); *H01L 27/3258* (2013.01);
(Continued)

(58) Field of Classification Search
CPC ............ H01L 27/3225; H01L 27/3246; H01L 27/3258; H01L 51/0097; H01L 51/56; H01L 2227/323; H01L 2251/5338
(Continued)

(56) References Cited

U.S. PATENT DOCUMENTS 10,338,449 B2   7/2019  Kang et al.
2010/0020041 A1*  1/2010  Park ..................... G06F 3/044
                                                    345/174
(Continued)

FOREIGN PATENT DOCUMENTS

CN   107451576 A   12/2017
CN   108666355 A   10/2018
(Continued)

OTHER PUBLICATIONS

English Machine Translation of CN109166862 (Year: 2019).*
English Machine Translation of CKR20170039537 (Year: 2017).*
English Machine Translation of CN107451576 (Year: 2017).*

*Primary Examiner* — Dzung Tran
(74) *Attorney, Agent, or Firm* — Mark M. Friedman

(57) ABSTRACT

A display panel and a method of manufacturing the display panel, and a display device are disclosed. The display panel includes a display area and a non-display area. The display area includes a first display area and a second display area both bendable in relation to each other. The display panel includes a base substrate, a thin-film transistor layer, and a sensor. One or a plurality of through holes or grooves are disposed on the thin-film transistor layer, and the second is disposed facing the through hole or the groove.

7 Claims, 4 Drawing Sheets

(51) Int. Cl.
*H01L 51/56* (2006.01)
*H04M 1/02* (2006.01)

(52) U.S. Cl.
CPC .......... *H01L 51/0097* (2013.01); *H01L 51/56* (2013.01); *H01L 2227/323* (2013.01); *H01L 2251/5338* (2013.01); *H04M 1/0245* (2013.01)

(58) Field of Classification Search
USPC .......................................................... 257/40
See application file for complete search history.

(56) References Cited

U.S. PATENT DOCUMENTS

| | | | |
|---|---|---|---|
| 2017/0269749 A1* | 9/2017 | Bok | ........................ G06F 3/0445 |
| 2017/0317155 A1* | 11/2017 | Oh | ........................ H01L 27/1255 |
| 2018/0089485 A1* | 3/2018 | Bok | ........................ G06F 1/1684 |
| 2019/0325190 A1* | 10/2019 | Cui | ..................... H01L 27/3269 |
| 2019/0332842 A1* | 10/2019 | Zhou | ........................ G06F 21/84 |

FOREIGN PATENT DOCUMENTS

| | | |
|---|---|---|
| CN | 109148528 A | 1/2019 |
| CN | 109887963 A | 6/2019 |
| WO | 2018212089 | 11/2018 |

\* cited by examiner

DISPLAY PANEL AND MANUFACTURING METHOD THEREOF, AND DISPLAY DEVICE

BACKGROUND OF INVENTION

1. Field of Invention

The present invention relates to a technical field of displays, and particularly to, a display panel and a manufacturing method thereof, and a display device.

2. Related Art

Flexible organic lighting-emitting diodes are flexible OLEDs for short, and are fabricated on flexible substrates as well as operating on the flexible substrates. In comparison with traditional glass-based displays, flexible OLEDs have advantages of being self-luminous, wide viewing angles, quick response times, wide temperature ranges, low driving voltages, low power consumption, high brightness, simple production processes, being compact, and displaying in a bending manner, etc.

OLEDs are currently mainly used in smart phones, home appliances, and televisions, and products, such as smart watches and VR devices, of which smart phones account for the highest proportion, reaching 70.6%. A key advantage of OLEDs lies in their flexibility, that is, they can achieve "flexible" display, and increase application scenes and imaginary usages of traditional display screens.

Currently, "flexible" screens are developing in both "bendable" and "foldable" directions. Development of smart phones has entered a state of stock competition, and folding mobile phones will inevitably become the development trend of increasing differentiated competition in the future. Flexible folding displays are primary core components for folding mobile phones.

Flexible foldable mobile phones have horizontal center lines on mobile phone screens. When users do not use the mobile phones, the mobile phones can be folded up along the horizontal center lines of the mobile phone screens. When users are using the phones, the phones can be expanded along the horizontal lines of the mobile phone screens. In this manner, when the phones are folded and not used, flexible displays are off, reducing power consumption, and increasing standby time and lifespan of the displays. When the phones are unfolded and used, the flexible displays are automatically turned on to show images as desired for users. Therefore, flexible foldable mobile phones have a function of automatically turning off screens and turning on screens, and such a function is generally implemented by sensors, Hall sensors, or light sensors. But there is still room for improvement in accuracy of triggering a screen off or a screen on. Currently, mobile phone manufactures put these sensors in mobile phone cases and mobile phone hardware chip systems. Since the sensors and display screens are separate components, the sensors take up space in the mobile phones, resulting in not only an increase in thickness of the mobile phones, but also a need of covering of non-transparent panels, thereby reducing a screen ratio of the mobile phones.

SUMMARY OF INVENTION

The present invention is to provide a display panel and a manufacturing method thereof, and a display device to overcome technical problems of poor accuracy of turning on or turning off a display screen, large thickness of mobile phones, and low screen ratios in prior art.

In order to achieve the above-mentioned objects, the present embodiment provides a display panel, comprising a display area and a non-display area, wherein the display area comprises a first display area and a second display area both bendable in relation to each other. The display panel comprises a base substrate, a thin-film transistor layer, and a sensor. The thin-film transistor layer is disposed on a surface of the base substrate, wherein the thin-film transistor layer in the first display area is provided with a through hole extending through the thin-film transistor layer, or a side of the thin-film transistor layer away from the base substrate in the first display area is provided with a groove. The sensor is disposed on a side of the base substrate away from the through hole or the groove, and comprises an emitting surface and a receiving surface, wherein the emitting surface and the receiving surface are disposed facing the through hole or the groove.

Furthermore, the thin-film transistor layer comprises a barrier layer, a buffer layer, a first insulting layer, a second insulating layer, a dielectric layer, and a planarization layer. The barrier layer is disposed on a surface of the base substrate; the buffer layer is disposed on a surface of the barrier layer away from the base substrate; the first insulating layer is disposed on a surface of the buffer layer away from the base substrate; the second insulating layer is disposed on a surface of the first insulating layer away from the base substrate; the dielectric layer is disposed on a surface of the second insulating layer away from the base substrate; and the planarization layer is disposed on a surface of the dielectric layer away from the base substrate.

Furthermore, the through hole extends through the planarization layer, the second insulating layer, the first insulting layer, the buffer layer, and the barrier layer in turn, or the groove extends through the planarization layer, the second insulating layer, the first insulting layer, and the buffer layer in turn and is recessed into the surface of the barrier layer away from the base substrate.

Furthermore, the display panel further comprises a pixel definition layer disposed on a surface of the planarization layer away from the base substrate and configured to fill up the through hole or the groove.

Furthermore, the planarization layer is made of a light-absorbing organic photoresist material.

Furthermore, the display panel further comprises a plurality of pixel units, wherein each of the pixels units is disposed in the corresponding through hole.

In order to achieve the above-mentioned objects, the present invention further provides a display device comprising the aforementioned display panel.

In order to achieve the above-mentioned objects, the present invention further provides a method of manufacturing a display panel, and the display panel comprises a display area and a non-display area, wherein the display area comprises a first display area and a second display area both bendable in relation to each other. The method comprises following steps: a base substrate providing step: providing a base substrate; a thin-film transistor layer fabrication step: fabricating a thin-film transistor layer on a surface of the base substrate; a through hole formation step: forming a through hole by penetrating the thin-film transistor layer in the first display area, or a groove formation step: forming a groove on a surface of the thin-film transistor layer in the first display area away from the base substrate; and a sensor disposing step: disposing a sensor below the base substrate, wherein the sensor comprises an emitting surface and a receiving surface, and the emitting surface and the receiving surface are disposed facing the through hole.

Furthermore, the thin-film transistor layer fabrication step comprises: a barrier layer fabrication step: fabricating a barrier layer on a surface of the base substrate; a buffer layer fabrication step: fabricating a buffer layer on a surface of the barrier layer; a first insulating layer fabrication step: fabricating a first insulating layer on a surface of the buffer layer; a second insulating layer fabrication step: fabricating a second insulating layer on a surface of the first insulating layer; a dielectric layer fabrication step: fabricating a dielectric layer on a surface of the second insulating layer; and a planarization layer fabrication step: fabricating a planarization layer on a surface of the dielectric layer.

Furthermore, in the through hole formation step, the through hole is formed to extend through the planarization layer, the second insulating layer, the first insulting layer, the buffer layer, and the barrier layer; or in the groove formation step, the groove is formed to extend through the planarization layer, the second insulating layer, the first insulting layer, and the buffer layer and is recessed into a surface of the barrier layer away from the base substrate; and wherein the method further comprises a pixel definition layer fabrication step implemented after the through hole formation step or the groove formation step, wherein the pixel definition layer fabrication step comprises fabricating a pixel definition layer on a surface of the planarization layer, and the pixel definition layer is configured to fill up the through hole or the groove.

The present invention has technical effects as follows: a display panel and a method of manufacturing the display panel, and a display device are provided. One or a plurality of through holes or grooves are provided on the thin-film transistor layer, so that the sensor is disposed facing the through hole or the groove, and the through hole or the groove is configured with a strong signal transmittance, thereby to improve accuracy of turning off or turning on the screen of the display panel. Furthermore, the sensor disposed below the display area of the display panel, or in the base substrate, or in the thin-film transistor layer can make more space for the display area of the display panel, increase a screen ration of the display panel, and achieve an ultra-narrow bezel display panel.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
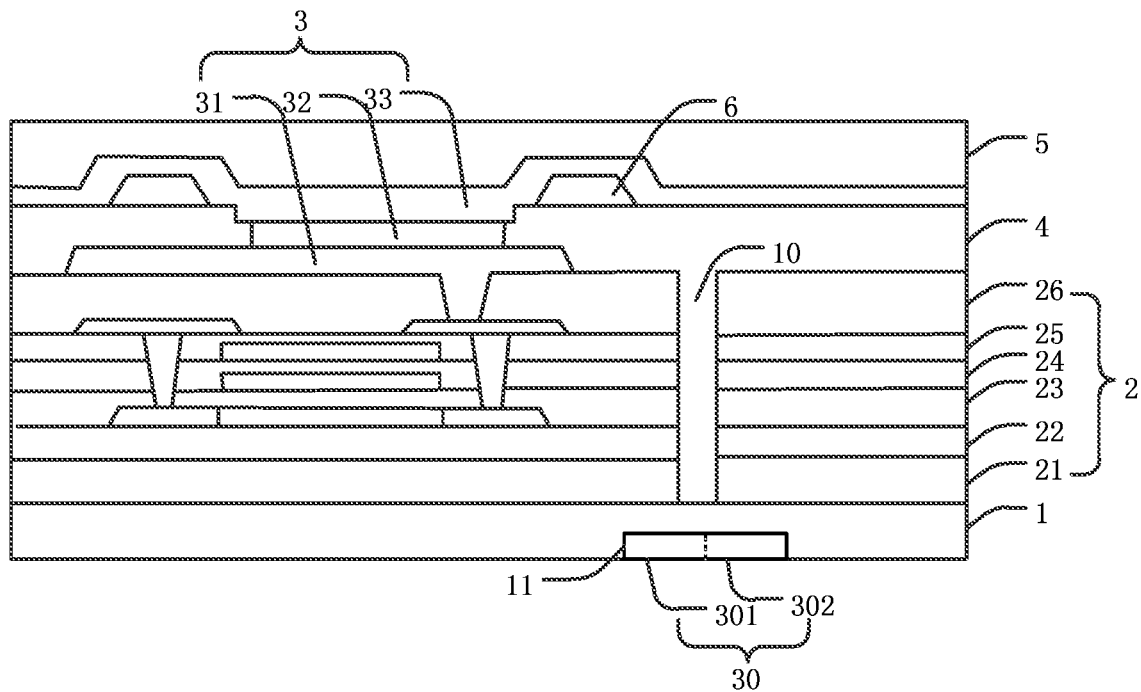
FIG. 1 is a schematic structural view of a display panel of a first embodiment.

The preferred embodiments of the present invention are described below with reference to the accompanying drawings to illustrate that the present invention can be implemented. These embodiments can fully introduce the technical content of the present invention to those skilled in the art, so that the technical content of the present invention is clearer and easier to understand. However, the invention may be embodied in many different forms of embodiments, and the scope of the invention is not limited to the embodiments set forth herein.

The terms used in the description of the present invention are intended to describe a particular embodiment, and are not intended to illustrate the concept of the invention. Expressions used in the singular encompasses the plural form of expression unless the context clearly dictates otherwise. In the description of the present invention, it is to be understood that the terms such as "include", "have", and "include" are intended to describe the possibility of one or more other features, numbers, steps, actions, or combinations disclosed in the present invention, and are not intended to exclude the possibility that one or more other features, numbers, steps, acts, or combinations thereof may be added. The same reference numerals in the drawings denote the same parts.

Embodiment 1

The present embodiment provides a display device, including a display panel, a touch panel, and a cover. The touch panel and the cover are sequentially disposed on a surface of the display panel.

As shown in FIG. 1, the present embodiment provides the display panel including a base substrate 1, a thin-film transistor layer 2, a light-emitting film layer 3, a pixel definition layer 4, a thin-film encapsulation layer 5, a column spacer 6, a through hole 10, and a sensor 30. The display panel includes a plurality of pixel units. Each of the pixel units is provided with the through hole 10 for increasing light transmittance, thereby improving a light extraction rate of the sensor 30.

The base substrate 1 is a flexible transparent polyimide substrate, mainly made of polyimide capable of effectively increasing light transmittance.

The thin-film transistor layer 2 is disposed on an upper surface of the base substrate 1. The thin-film transistor layer 2 includes a barrier layer 21, a buffer layer 22, a first insulating layer 23, a second insulating layer 24, a dielectric layer 25, and a planarization layer 26 from bottom to top. The thin-film transistor layer 2 further includes an active layer, a first gate, a second gate, and a source/drain electrode. The barrier layer 21, the buffer layer 22, the first insulating layer 23, the second insulating layer 24, the dielectric layer 25 are made of an inorganic material, including one of silicon nitride, silicon oxide, and silicon oxynitride, but not limited in this embodiment, as long as it can function as insulation, barrier moisture and oxygen, etc., thereby to prevent each electrode in the display panel from being short-circuited as well as prevent external moisture and oxygen from intruding into the display panel, so that a lifespan of the display panel can be extended. The planarization layer 26 has a thickness between 100 nanometers (nm) and 5000 nm, and is made of a light-absorbing organic photoresist material having a light-absorbing characteristic, preferably a black organic polymer photoresist for absorbing stray visible light.

The pixel definition layer 4 is disposed on an upper surface of the planarization layer 26. The column spacer 6 is disposed on an upper surface of the pixel definition layer 4.

The light-emitting layer 3 is disposed on an upper surface of the thin-film transistor layer 2. The light-emitting film layer 3 is an OLED device including a first electrode 31, a light-emitting layer 32, and a second electrode 33. The first electrode 31 is disposed on an upper surface of the planarization layer 26, and the first electrode 31 is connected to the source/drain electrode through a connection (CNT) hole. The light-emitting layer 32 is disposed on an upper surface of the first electrode 31. The second electrode 33 is disposed on upper surfaces of the light-emitting layer 32, the pixel definition layer 4, and the column spacer 6, wherein the first electrode 31 is an anode, and the second electrode is a cathode.

The thin-film encapsulation layer 5 is disposed on an upper surface of the light-emitting layer 3. The thin-film encapsulation layer 5 includes an organic encapsulation layer and an inorganic encapsulation layer. The thin-film encapsulation layer 5 is provided to block moisture and oxygen, extending a lifespan of the light-emitting film layer, thereby increasing a lifespan of the display panel.

The sensor 30 is disposed below the base substrate 1. The sensor 30 is tightly attached to the base substrate 1, or may be disposed inside the base substrate 1, or a sensing integrated circuit of the sensor 30 may be integrated in the thin-film transistor layer 2, thereby reducing a space taken up by the sensor 30 in the display panel, making the display panel lighter, and increasing a screen ration of the display panel. When the sensor 30 is disposed in the base substrate 1, a side of the base substrate 1 facing the sensor is provided with an engaging groove 11 in which the sensor 30 is disposed. The sensor 30 may be a distance sensor, a light sensor, a temperature sensor, etc., and the sensor in this embodiment is preferably a distance sensor, which will be described below. The sensor 30 is configured to detect a state in which the display panel is folded or unfolded, so that the display panel achieves effects of turning off a screen or turning on the screen.

As shown in FIG. 1, the display panel includes the through hole 10 extending through the thin-film transistor layer 2. Specifically, the through hole 10 extends through the planarization layer 26, the second insulating layer 25, the first insulting layer 23, the buffer layer 22, and the barrier layer 21 in turn. The pixel definition layer 4 is configured to fill up the through hole 10.

In this embodiment, the sensor 30 includes an emitting surface 301 and a receiving surface 302, wherein the emitting surface 301 and the receiving surface 302 are disposed facing the through hole 10 or a groove 20. A distance between the through hole 10 and the sensor 30 is a thickness of the base substrate 1 or one third to one half of the thickness of the base substrate 1, and a specific value of the distance depends on accuracy of the sensor and design of the through hole 10 or the groove 20, and is not limited in this embodiment. The distance is configured to improve accuracy of the sensor 30 for signal transmitting or signal receiving. In this embodiment, the groove 20 has a pore diameter of 3 microns (um) to 7 um, preferably 3 um, 3.5 um, 4 um, 4.5 um, 5 um, or 6 um. In this embodiment, the pore diameter is preferably as small as possible, as long as the external light can be scattered from the display panel to the sensor 30 so that the emitting surface 301 and the receiving surface 302 of the sensor 30 can be normally operated. A specific size of the pore diameter is determined by precision of the sensor and a resolution of a product, and is not particularly limited in this embodiment.

Furthermore, the through hole 10 allows signals, such as optical signals, sound waves, and the like to pass, and the emitting surface 301 is used to transmit a detecting signal to the outside. The detecting signal is transmitted to the outside through the through hole 10, and the through hole 10 can improve transmittance of the signal transmitted from the emitting surface 301.

Figure 2:
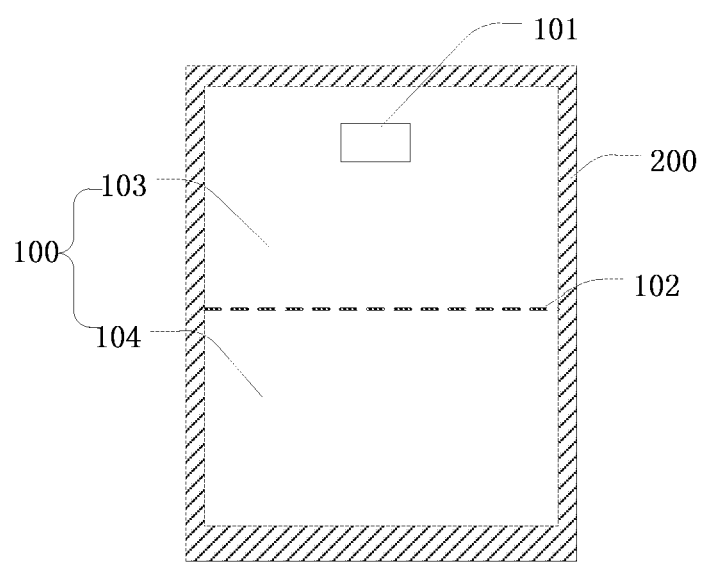
FIG. 2 is a plan view of the display panel of the first embodiment.

As shown in FIGS. 1-2, the display panel includes a display area 100 and a non-display area 200, wherein the non-display area 200 surrounds the display area 100. The display area 100 is defined into a first display area 103 and a second display area 104 by a folding line 102. The first display area 103 and the second display area 104 are bendable in relation to each other. The bendable line 102 is disposed in the display area 100, and the folding line 102 is varied according to a folding pattern of the product, so a specific position of the folding line is not limited in this embodiment. The first display area 103 and the second display area 104 have a same structure, and a size of the first display area 103 and the second display area 104 can be customized. In this embodiment, a sensor area 101 is defined in the first display area 103 to correspond to one or a plurality of the through holes 10. Specifically, each of the through holes 10 extends through the thin-film transistor layer of the first display are 103. The sensor is disposed facing one or the plurality of the through holes 10. In addition, the display area 100 may be provided with one or a plurality of the sensor areas 101, but not limited thereto.

The display panel of the present embodiment has the characteristics of flexible folding and can be foldable and expandable. When the display panel is used for watching television, playing video games, or reading, users can use the display panel in an expanded state with a large screen size to enhance the user experience; when the display panel is used for being carried or phone calling, users can use the display panel in a folded state to reduce a size of the display panel for users' convenience of holding or carrying.

As shown in FIGS. 1-2, when the detecting signal is transmitted to an object being detected (i.e., the second display area 104 of the display panel), the detecting signal turns to a reflected signal. The reflected signal is transmitted to the receiving surface 302 through the through hole 10. After receiving the reflected signal, the receiving surface 302 can transmit the received signal to a processor of the display panel for processing. A distance between the first display area 103 and the second display area 104 is different when the display panel is expanded or folded, and such a difference leads to a change in time of transmitting the signal from the emitting surface to the receiving surface, thereby to control the screen of the display panel to be turned off or turned on.

When the display panel is in the expanded state, all of display areas of the display panel are on a same plan. Specifically, the emitting surface 301 of the sensor 30 is configured to emit infrared, and the infrared is emitted to outside through the through holes 10 or the grooves 20. The infrared cannot detect a light signal of the display panel blocked by the display panel itself, so that the infrared generates a reflected signal A. The receiving surface 302 of the sensor 30 receives the reflected signal A from the emitting surface 301, and the reflected signal A received by the receiving surface 302 is transmitted through the receiving surface 302 to the processor of the display panel for processing, thereby to keep the screen of the display panel on. It should be noted that the light signal blocked by itself as described above is referred to as a light signal generated by the display panel itself. The light signal of the display panel is different from a light signal generated by ambient light. Therefore, the infrared generates the reflected signal A, and feeds the reflected signal A to the receiving surface 302, thereby keeping the screen of the display panel on.

When the display panel is in the folded state, the first display area 103 and the second display area 104 of the display panel cooperatively form an angle X between 0-180 degrees. When $0°≤X≤90°$, the infrared passing through the through hole 10 or the groove 20 cannot detect the light signal blocked by itself. At this time, the infrared also generates a reflected signal A. The receiving surface 302 of the sensor 30 receives the reflected signal A transmitted back from the emitting surface 301, and transmits the reflected signal A being received to the processor of the display panel for processing, thereby to keep the screen of the display panel on. When $0°≤X≤180°$, the first display are 103 and the second display area are gradually close to each other, so that the light signal blocked by the display panel itself and detected by the infrared passing through the through hole 10 or the groove 20 is getting stronger. As this time, the infrared will generate a reflected signal B, the receiving surface 302 of the sensor 30 receives the reflected signal B transmitted back from the emitting surface 301 and then transmits the reflected signal B being received to the processor of the display panel for processing, thereby to keep the screen of the display panel off. In this embodiment, the display panel may be provided with a plurality of the sensors 30, a plurality of the through holes 20 or the grooves 20 may be disposed in the thin-film transistor layer 2, and the emitting surface 301 and the receiving surface 302 of the sensor 30 are disposed facing the through hole 10 or the groove 20, thereby to improve accuracy of turning off or turning on the screen of the display panel. When the sensor 30 is disposed on a periphery the folding line 102, inasmuch as the sensor 30 is disposed at a bottom of the first display area 103, a speed at which the first display area 103 is close to a top of the second display area 104 is defined as V1. When the sensor 30 is disposed on a middle of the first display area 103 or on a middle of the second display area 102, the middle of the first display area 103 and the middle of the second display area 104 are slowly close to each other at a speed defined as V2. When the sensor 30 is disposed on a top of the first display area 103 or on a bottom of the second display area 104, the top of the first display area 103 and the bottom of the second display area 104 are slowly close to each other at a speed defined as V3, wherein V1<V2<V3. As a result, when the sensor 30 is disposed on the periphery of the folding line 102, a time spent on truing off the screen of the display panel is shortest. Those skilled in the art can define a position of the sensor according to actual needs, and it is not limited in the present embodiment. Certainly, a plurality of the sensors 30 may be spread on the display panel to further improve accuracy of turning off or turning on the screen of the display panel.

When the display panel is in the folded state, the first display area 103 and the second display area 104 of the display panel are completely in contact with each other, and a distance between the first display area 103 and the second display area 104 is very short. Specifically, the emitting surface 301 of the sensor 30 is configured to emit infrared. The infrared is emitted through the through hole 10 to the second display area 104 opposite to the first display area 103. A time that the infrared transmitted from the emitting surface 301 to the receiving surface 302 is very short. At this time, the infrared will generate a reflected signal B, the receiving surface 302 of the sensor 30 receives the reflected signal B transmitted back from the emitting surface 301 and then transmits the reflected signal B being received to the processor of the display panel for being processed according to a time of transmitting the signal, thereby to make the screen of the display panel off.

The reflected signal A as mentioned above is also referred to as a first light signal not being blocked by the display panel itself and is not being detected by the infrared. The reflected signal B is also referred to as a second light signal being blocked by the display panel itself and being detected by the infrared. The through hole 10 is configured with a strong signal transmittance, so that the infrared can accurately acquire a light signal of the display panel itself. Then, the emitting surface 301 transmits the reflected signal A or B being generated to the receiving surface 302, thereby to control a screen off state or a scree on state of the display panel, and to improve the accuracy of turning off or turning on the screen of the display panel. The sensor 30 used in this embodiment is a distance sensor, and detects a light signal of the display panel by emitting a detecting signal with the infrared. Specifically, the distance sensor detects a change of distance between the distance sensor and the second display area 104, wherein in the expanded state, the first light signal is not blocked by the display panel causing the change of distance to increase, and wherein in the folded state, the first light signal is blocked by the display panel causing the change of distance to decrease. In other embodiments, the distance sensor may detect the light signal of the display panel by using an ultrasonic detection signal or other signals, which is not specifically limited in this embodiment.

Furthermore, whatever the display panel is in the expanded state or in the folded state, the planarization layer 26 absorbs stray light scattered around the through hole 10 to prevent the stray light from interfering with a normal operation of the sensor 30, thereby improving the accuracy of turning off or turning on the screen of the display panel. In comparison with the prior art, the sensor 30 of the present embodiment disposed below the display area of the display panel, or in the base substrate, or in the thin-film transistor layer can make more space for the display area of the display panel, increase a screen ration of the display panel, and achieve an ultra-narrow bezel display panel.

Figure 3:
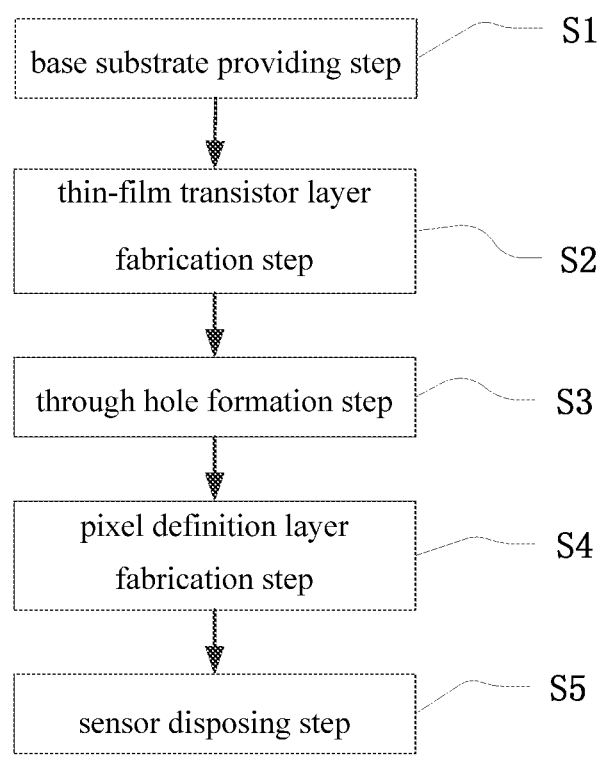
FIG. 3 is a flowchart of a method of manufacturing the display panel of the first embodiment.

As shown in FIG. 3, the present embodiment further provides a method of manufacturing a display panel, the display panel including a display area and a non-display area, wherein the display area includes a first display area and a second display area both bendable in relation to each other. The method includes steps S1-S5 as follows:

S1: a base substrate providing step: providing a base substrate.

S2: a thin-film transistor layer fabrication step: fabricating a thin-film transistor layer on a surface of the base substrate.

Figure 4:
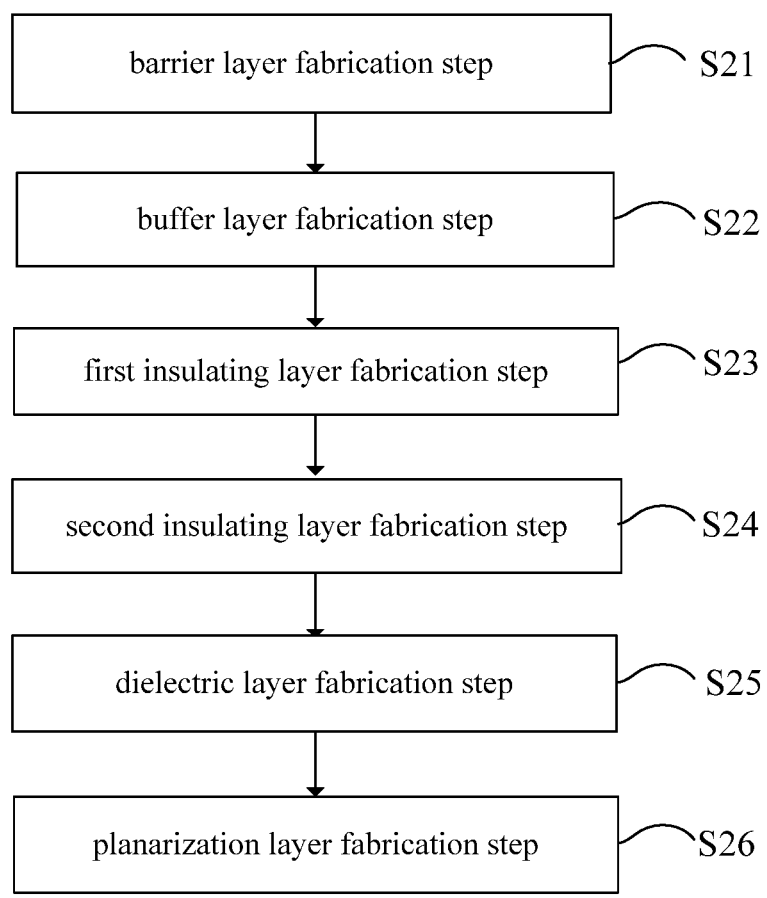
FIG. 4 is a flowchart showing fabrication steps of a thin-film transistor layer of the first embodiment.

As shown in FIG. 4, the thin-film transistor layer fabrication step includes steps S21-S26 as follows. S21: a barrier layer fabrication step: fabricating a barrier layer on a surface of the base substrate. S22: a buffer layer fabrication step: fabricating a buffer layer on a surface of the barrier layer. S23: a first insulating layer fabrication step: fabricating a first insulating layer on a surface of the buffer layer. S24: a second insulating layer fabrication step: fabricating a second insulating layer on a surface of the first insulating layer. S25: a dielectric layer fabrication step: fabricating a dielectric layer on a surface of the second insulating layer. S26: a planarization layer fabrication step: fabricating a planarization layer on a surface of the dielectric layer, wherein the planarization layer has a thickness between 100 between 100 nm-5000 nm and is made of a light-absorbing organic photoresist material having a light-absorbing characteristic, preferably a black organic polymer photoresist for absorbing stray visible light.

S3: a through hole formation step: forming a through hole by penetrating the thin-film transistor layer in the first display area. The through hole extends through the planarization layer, the second insulating layer, the first insulting layer, the buffer layer, and the barrier layer.

S4: a pixel definition layer fabrication step: fabricating a pixel definition layer on a surface of the planarization layer, and the pixel definition layer is configured to fill up the through hole.

S5: a sensor disposing step: disposing a sensor below the base substrate, wherein the sensor includes an emitting surface and a receiving surface, and the emitting surface and the receiving surface are disposed facing the through hole.

A column spacer fabrication step, a light-emitting layer fabrication step, and a thin-film encapsulation layer fabrication step are further included between the pixel definition layer fabrication step and the sensor disposing step. In the column spacer fabrication step, a column spacer is fabricated on the pixel definition layer; in the light-emitting layer fabrication step, a light-emitting layer is fabricated on a surface of the thin-film transistor layer; and in the thin-film encapsulation layer fabrication step, a thin-film encapsulation layer is fabricated on the light-emitting layer.

Based on the display panel and the method of manufacturing the display panel of the present embodiment, one or a plurality of through holes are provided on the thin-film transistor layer, so that the sensor is disposed facing the through hole, and the through hole is configured with a strong signal transmittance, thereby to improve accuracy of turning off or turning on the screen of the display panel. Furthermore, the sensor disposed below the display area of the display panel, or in the base substrate, or in the thin-film transistor layer can make more space for the display area of the display panel, increase a screen ration of the display panel, and achieve an ultra-narrow bezel display panel.

Embodiment 2

The present embodiment provides a display panel and a manufacturing method thereof, and a display device, including most of the technical solutions of the first embodiment, wherein a distinctive feature is that the display panel includes a groove instead of the through hole.

Figure 5:
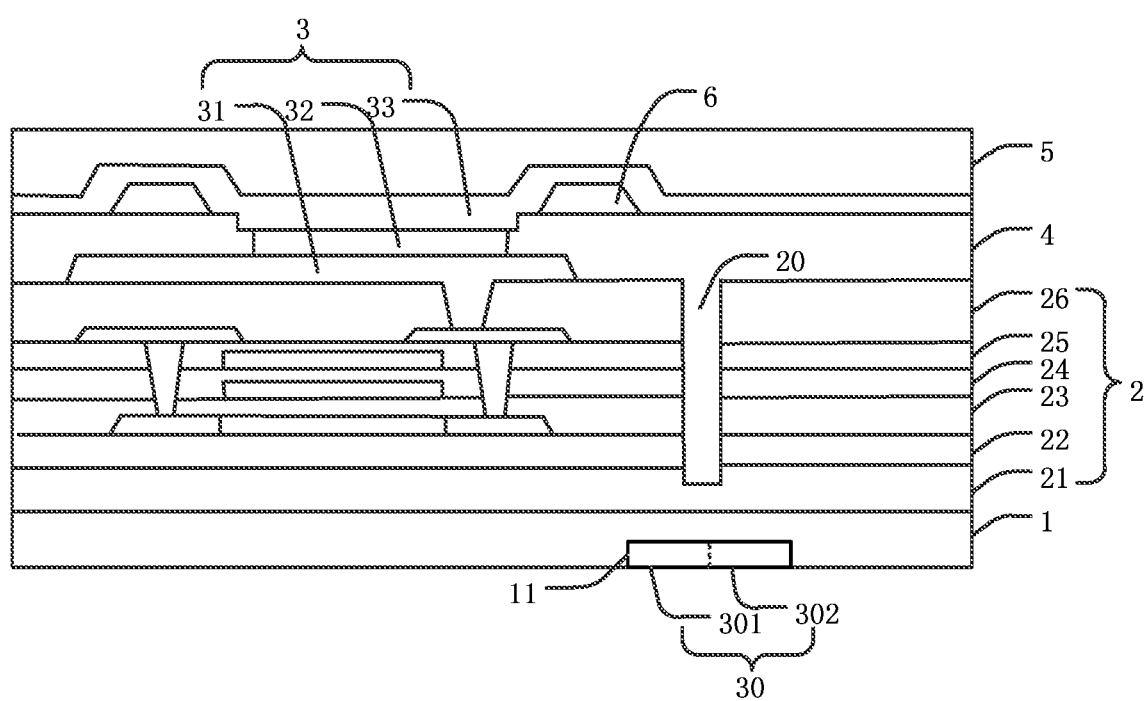
FIG. 5 is a schematic structural view of a display panel of a second embodiment.

As shown in FIG. 5, the display panel includes a groove 20. The groove 20 extends through the planarization layer 26, the second insulating layer 25, the first insulting layer 23, and the buffer layer 22 in turn, and is recessed in a surface of the barrier layer 21 away from the base substrate 1. The pixel definition layer 4 is configured to fill up the through hole 10. The barrier layer 21 is made of a transparent material so that transmitting and receiving functions of the sensor 30 will not be affected. Please review FIG. 5 in combination with FIG. 2, a sensor area 101 is defined in the first display area 103 to correspond to one or a plurality of the grooves 20. Specifically, the groove 20 is disposed in the thin-film transistor layer of the first display area 103, and the sensor is disposed facing one or the plurality of the grooves 20. The groove 20 has a pore diameter of 3 um to 7 um, preferably 3 um, 3.5 um, 4 um, 4.5 um, 5 um, or 6 um. In this embodiment, the pore diameter is preferably as small as possible, as long as the external light can be scattered from the display panel to the sensor 30 so that the emitting surface 301 and the receiving surface 302 of the sensor 30 can be normally operated. A specific size of the pore diameter is determined by precision of the sensor and a resolution of a product, and is not particularly limited in this embodiment.

The present embodiment further provides a method of manufacturing a display panel, including most of the technical solutions of the method of manufacturing the display panel in the first embodiment, wherein a distinctive feature is that the method of manufacturing the display panel includes a groove formation step instead of the through hole formation step. In the groove formation step, a groove is formed to be recessed in a surface of the thin-film transistor layer away from the base substrate.

The method of manufacturing the display panel includes steps implemented in order as follows: a base substrate providing step, a thin-film transistor layer fabrication step, a groove formation step, a pixel definition layer fabrication layer, and a sensor disposing step. In the groove formation step, the groove is formed on a surface of the thin-film transistor layer in the first display area away from the base substrate.

Based on the display panel and the method of manufacturing the display panel of the present embodiment, one or a plurality of grooves are provided on the thin-film transistor layer, so that the sensor is disposed facing the groove, and the groove is configured with a strong signal transmittance and to improve accuracy of turning off or turning on the screen of the display panel. Furthermore, the sensor disposed below the display area of the display panel, or in the base substrate, or in the thin-film transistor layer can make more space for the display area of the display panel, increase a screen ration of the display panel, and achieve an ultra-narrow bezel display panel.

The above disclosure is only the preferable embodiments of the present application, and is not intended to limit the present application. Any modifications, equivalent substitutions and improvements made within the spirit and principles of the present application should be included in the scope of claims of the present application

What is claimed is:

1. A display panel, comprising a display area and a non-display area, wherein the display area comprises a first display area and a second display area both bendable in relation to each other to enable a folded state or an expanded state of the display panel, wherein in the folded state, the first display area and the second display area are bent toward each other, and wherein in the expanded state, the first display area and the second display area are bent away from each other, and the display panel comprising:

a base substrate;

a thin-film transistor layer disposed on a surface of the base substrate, wherein the thin-film transistor layer in the first display area is provided with a through hole extending through the thin-film transistor layer, or a side of the thin-film transistor layer away from the base substrate in the first display area is provided with a groove; and a distance sensor disposed inside the base substrate in the first display area and located away from the through hole or the groove, and comprising an emitting surface and a receiving surface both disposed facing the through hole or the groove, wherein the emitting surface is configured to emit infrared light passing through the through hole or the groove for formation of a first light signal and a second light signal, and the receiving surface is configured to receive the first light signal or the second light signal through the through hole or the groove, wherein the distance sensor detects a change of distance between the distance sensor and the second display area, wherein in the expanded state, the first light signal is not blocked by the display panel causing the change of distance to increase, and wherein in the folded state, the first light signal is blocked by the display panel causing the change of distance to decrease.

2. The display panel of claim 1, wherein the thin-film transistor layer comprises:
 a barrier layer disposed on a surface of the base substrate;
 a buffer layer disposed on a surface of the barrier layer away from the base substrate;
 a first insulating layer disposed on a surface of the buffer layer away from the base substrate;
 a second insulating layer disposed on a surface of the first insulating layer away from the base substrate;
 a dielectric layer disposed on a surface of the second insulating layer away from the base substrate; and
 a planarization layer disposed on a surface of the dielectric layer away from the base substrate.

3. The display panel of claim 1, wherein the through hole extends through the planarization layer, the second insulating layer, the first insulting layer, the buffer layer, and the barrier layer in turn, or the groove extends through the planarization layer, the second insulating layer, the first insulting layer, and the buffer layer in turn and is recessed into the surface of the barrier layer away from the base substrate.

4. The display panel of claim 1, further comprising a pixel definition layer disposed on a surface of the planarization layer away from the base substrate and filling up the through hole or the groove.

5. The display panel of claim 1, wherein the planarization layer is made of a light-absorbing organic photoresist material.

6. The display panel of claim 1, further comprising a plurality of pixel units, wherein each of the pixels units is disposed in the corresponding through hole.

7. The display panel of claim 2, wherein the barrier layer is made of a transparent material.

* * * * *